US010928556B2

(12) United States Patent
Wells et al.

(10) Patent No.: US 10,928,556 B2
(45) Date of Patent: Feb. 23, 2021

(54) OPTICALLY TRANSPARENT ACTUATOR

(71) Applicant: Facebook Technologies, LLC, Menlo Park, CA (US)

(72) Inventors: Spencer Allan Wells, Seattle, WA (US); Katherine Marie Smyth, Seattle, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/431,706

(22) Filed: Jun. 4, 2019

(65) Prior Publication Data

US 2020/0386916 A1 Dec. 10, 2020

Related U.S. Application Data

(60) Provisional application No. 62/852,892, filed on May 24, 2019.

(51) Int. Cl.
| | | |
|---|---|---|
| *C04B 35/626* | (2006.01) | |
| *G02B 1/116* | (2015.01) | |
| *C04B 35/497* | (2006.01) | |
| *C04B 35/468* | (2006.01) | |
| *C04B 35/04* | (2006.01) | |
| *C04B 35/622* | (2006.01) | |

(52) U.S. Cl.
CPC ............. *G02B 1/116* (2013.01); *C04B 35/04* (2013.01); *C04B 35/4688* (2013.01); *C04B 35/497* (2013.01); *C04B 35/62222* (2013.01); *C04B 35/62605* (2013.01)

(58) Field of Classification Search
CPC ... G02B 1/116; C04B 35/62222; C04B 35/04; C04B 35/497; C04B 35/62605; C04B 35/4688
See application file for complete search history.

(56) References Cited

U.S. PATENT DOCUMENTS 7,405,884 B2 \* 7/2008 Nishioka ................. G02B 3/14
348/E5.025

FOREIGN PATENT DOCUMENTS

| CN | 107216149 A | 9/2017 |
| EP | 0 381 524 A2 | 8/1990 |
| JP | 2014-133670 A | 7/2014 |

OTHER PUBLICATIONS

Sabat. Characterization of PLZT Ceramics for Optical Sensor and Actuator Devices. Ceramic Materials—Progress in Modern Ceramics. Apr. 2012, pp. 1-24.\*

(Continued)

*Primary Examiner* — Noah S Wiese
(74) *Attorney, Agent, or Firm* — FisherBroyles, LLP

(57) ABSTRACT

An electroactive ceramic may be incorporated into a transparent optical element and may characterized by an average grain size of less than 200 nm, a relative density of at least 99%, and a transmissivity within the visible spectrum of at least 50%, while maintaining a $d_{33}$ value of at least 20 pC/N. Optical properties of the electroactive ceramic, including transmissivity, haze, and clarity may be substantially unchanged during actuation of the optical element and the attendant application of a voltage to a layer of the electroactive ceramic.

20 Claims, 12 Drawing Sheets

(56) References Cited

OTHER PUBLICATIONS

Randall et al. Intrinsic and Extrinsic Size Effects in Fine-Grained Morphotropic-Phase-Boundary Lead Zirconate Titanate Ceramics. J. Am. Ceram. Soc., 81 [3] 677-88 (1998).*

Xia et al., "Electrically induced light scattering performances of lanthanum-modified lead zirconate titanate transparent ceramics", J Electroceram, vol. 29, 2012, pp. 192-197.

Yoshikawa et al., "Fabrication of Transparent Lead Lanthanum Zirconate Titanate Ceramics from Fine Powders by Two-Stage Sintering", J. Am. Ceram. Soc., vol. 75, No. 9, 1992, pp. 2520-2528.

Zhou et al., "Abnormal electric-field-induced light scattering in Pb(Mg1/3Nb2/3)O3—PbTiO3 transparent ceramics", Applied Physics Letters 106, 122904, 2015, 5 pages.

Yue et al., "Building submicron crystalline piezoceramics: One-step pressureless sintering partially amorphized nanopowder", Journal American Ceramic Society, vol. 102, 2019, pp. 2658-2665.

Stoner et al., "Chemical Control of Correlated Metals as Transparent Conductors", Advanced Functional Materials, 1808609, 2019, pp. 1-7.

Wang et al., "Cold sintering and electrical characterization of lead zirconate titanate piezoelectric ceramics", APL Materials, vol. 6, 016101, 2018, 8 pages.

Maria et al., "Cold sintering: Current status and prospects", J. Mat. Res., Jul. 19, 2017, pp. 1-14.

Zhang et al., "Comparison of PMN-PT transparent ceramics processed by three different sintering method", J Mater Sci: Mater Electron, vol. 28, 2017, pp. 15612-15617.

Zhang et al., "Correlated metals as transparent conductors", Nature Materials, vol. 15, Feb. 2016, pp. 204-211.

Hackenberger et al., "Effect of grain size on actuator properties of piezoelectric ceramics", Proc. SPIE 3324, Smart Structures and Materials 1998: Smart Materials Technologies, Jul. 20, 1998, 10 pages.

Ji et al., "Effects of PMN/PT ratio on optical and electro-optic properties of PLMNT transparent ceramics", Ceramics International, vol. 41, No. 9, Part A, Nov. 2015, pp. 10387-10393.

Zhou et al., "Electric Field-Induced Light Scattering in Eu-Doped PMN-PT Transparent Ceramics", J. Am. Ceram. Soc., 2016, pp. 1-7.

Randall et al., "Extrinsic contributions to the grain size dependence of relaxor ferroelectric Pb(Mgi/3Nb2/3)O3 : PbTiO3 ceramics", J. Mater. Res., vol. 8, No. 4, Apr. 1993, pp. 880-884.

Swartz et al., "Fabrication of Perovskite Lead Magnesium Niobate", Mat. Res. Bull., vol. 17, 1982, pp. 1245-1250.

Guillon et al., "Field-Assisted Sintering Technology/Spark Plasma Sintering: Mechanisms, Materials, and Technology Developments", Advanced Engineering Materials, vol. 16, No. 7, 2014, pp. 830-849.

Fujii et al., "Fabrication of Transparent Pb(Mg1/3Nb2/3)O3—PbTiO3 Based Ceramics by Conventional Sintering", J. Am. Ceram. Soc., vol. 96, No. 12, Dec. 2013, pp. 3782-3787.

Li et al., "Giant piezoelectricity of Sm-doped Pb(Mg1/3Nb2/3)O3—PbTiO3 single crystals", Science 364, Apr. 19, 2019, pp. 1-5.

Cao et al., "Grain Size and Domain Size Relations in Bulk Ceramic Ferroelectric Materials", J. Phys. Chem Solids, vol. 57, No. 10, 1996, pp. 1499-1505.

Lee et al., "Hot Isostatic Pressing of Transparent Nd:YAG Ceramics", J. Am. Ceram. Soc., vol. 92, No. 7, Jul. 2009, pp. 1456-1463.

Deng et al., "Hydrothermal synthesis and characterization of nanocrystalline PZT powder", Materials Letters, vol. 57, 2003, pp. 1675-1678.

Zhao et al., "Influence of Cation Order on the Electric Field-Induced Phase Transition in Pb(Mg1/3Nb2/3)O3-Based Relaxor Ferroelectrics", J. Am. Ceram. Soc., vol. 89, No. 1, 2006, pp. 202-209.

Randall et al., "Intrinsic and Extrinsic Size Effects in Fine-Grained Morphotropic-Phase-Boundary Lead Zirconate Titanate Ceramics", J. Am. Ceram. Soc., vol. 81, No. 3, 1998, pp. 677-688.

Su et al., "Intrinsic versus extrinsic effects of the grain boundary on the properties of ferroelectric nanoceramics", Physical Review B, vol. 95, 054121, 2017, 12 pages.

Li et al., "The effect of domain structures on the transparency of PMN-PT Transparent Ceramics", Optical Materials, vol. 35, No. 4, Feb. 2013, pp. 722-726.

Chen et al., "Making Nanostructured Ceramics from Micrometer-Sized Powders via Grain Refinement During SPS Sintering", J. Am. Ceram. Soc., vol. 91, No. 8, 2008, pp. 2475-2480.

Cheng et al., "Microwave Sintering of Transparent Alumina", Materials Letters, vol. 56, Oct. 2002, pp. 587-592.

Zheng et al., "Nanocrystalline buildup, relaxor behavior, and polarization characteristic in PZT-PNZN quaternary ferroelectrics", J Am Ceram Soc., vol. 100, 2017, pp. 3033-3041.

Garnweitner et al., "Nonaqueous Synthesis of Amorphous Powder Precursors for Nanocrystalline PbTiO3, Pb(Zr, Ti)O3, and PbZrO3", Chem. Mater., vol. 17, No. 18, 2005, pp. 4594-4599.

Zhao et al., "Observation of an unusual optical switching effect in relaxor ferroelectrics Pb(Mg1/3Nb2/3)O3—Pb(Zr0.53, Ti0.47)O3 transparent ceramics", Appl. Phys. Lett. 104, 062907, 2014, 6 pages.

Badillo et al., "Preparation and Microstructural, Structural, Optical and Electro-Optical Properties of La Doped PMN-PT Transparent Ceramics", Optics and Photonics Journal, vol. 2, 2012, pp. 157-162.

Wei et al., "Optical characteristics of Er3+-doped PMN-PT transparent ceramics", Ceramics International, vol. 38, No. 4, May 2012, pp. 3397-3402.

Wan et al., "Optical properties of (1-x)Pb(Mg1/3Nb2/3))3-x PbTiO3 single crystals studied by spectroscopic ellipsometry", Journal of Applied Physics, vol. 96, No. 3, Aug. 1, 2004, 6 pages.

Wan et al., "Optical properties of tetragonal Pb,,Mg1Õ3Nb2O3 . . . 0.62Ti0.38O3 single crystal", Journal of Applied Physics, vol. 93, No. 8, Apr. 15, 2003, 4 pages.

Cutchen, J. Thomas, "PLZT thermal/flash protective goggles: Device concepts and constraints", Ferroelectrics, vol. 27, No. 1, 1980, 7 pages.

Zuo et al., "PMN-PT Ceramics Prepared by Spark Plasma Sintering", J. Am. Ceram. Soc., vol. 90, No. 4, 2007, pp. 1101-1106.

Harris et al., "Properties of an Infrared-Transparent MgO:Y2O3 Nanocomposite", J. Am. Ceram. Soc., vol. 96, No. 12, 2013, pp. 3828-3835.

Ruan et al., "Large Electra-Optic Effect in La-Doped 0.75Pb(Mg1/3Nb2/3)O3—0.25PbTiO3 Transparent Ceramic by Two-Stage Sintering", J. Am. Ceram. Soc., vol. 93, No. 8, 2010, pp. 2128-2131.

Ruan et al., "Origin of the giant electro-optic Kerr effect in La-doped 75PMN-25PT transparent ceramics", Journal of Applied Physics 110, 074109, 2011, 8 pages.

Ruan et al., "Fabrication of PMN-PZT Transparent Ceramics by Two-Stage Sintering", J. Am. Ceram. Soc., 2012, pp. 1-4.

Suárez et al., "Sintering to Transparency of Polycrystalline Ceramic Materials", Sintering of Ceramics—New Emerging Techniques, Mar. 2012, pp. 527-553.

Algueró et al., "Size effect in morphotropic phase boundary Pb(Mg1/3Nb2/3)O3—PbTiO3 Pb(Mg1/3Nb2/3)O3—PbTiO3", Applied Physics Letters 91, 112905, 2007, 4 pages.

Song et al., "Fabrication and ferroelectric/dielectric properties of La-doped PMN-PT ceramics with high optical transmittance", URL: http://dx.doi.org/10.1016/j.ceramint.2016.11.222, Ceramics International, 2016, pp. 1-6.

Kim et al., "Spark plasma sintering of transparent alumina", Scripta Materialia, vol. 57, 2007, pp. 607-610.

Xin-Ming et al., "Study on principal refractive indices of the ferroelectric single crystal 0.62Pb (Mg 1/3Nb2/3))3-0.38PbTiO3", Acta Physica Sinica, vol. 52, No. 9, Sep. 2003, 5 pages.

Zhang et al., "Temperature Dependence of Electric-induced Light Scattering Performance for PLZT Ceramics", J. Am. Ceram. Soc., vol. 97, No. 5, 2014, pp. 1389-1392.

Apetz et al., "Transparent Alumina: A Light-Scattering Model", J. Am. Ceram. Soc., vol. 86, No. 3, 2003, pp. 480-486.

Alvarez-Clemares et al., "Transparent Alumina/Ceria Nanocomposites by Spark Plasma Sintering", Advanced Engineering Materials, vol. 12, No. 11, 2010, pp. 1154-1160.

Goldstein et al., "Transparent Ceramics at 50: Progress Made and Further Prospects", J. Am. Ceram. Soc., vol. 99, No. 10, 2016, pp. 3173-3197.

(56) References Cited

OTHER PUBLICATIONS

Jiang et al., "Transparent electro-optic ceramics and devices", Proc. SPIE 5644, Optoelectronic Devices and Integration, Jan. 17, 2005, 16 pages.
Sternberg, A., "Transparent Ferroelectric Ceramics—recent trends and status QUO", Ferroelecrrics, vol. 131, No. 1, 1992, 12 pages.
Mao et al., "Transparent Polycrystalline Alumina Ceramics with Orientated Optical Axes", J. Am. Ceram. Soc., vol. 91, No. 10, 2008, pp. 3431-3433.
Tsai et al., "Ultrasonic spray pyrolysis for nanoparticles synthesis", Journal of Materials Science, vol. 39, 2004, pp. 3647-3657.
International Search Report and Written Opinion received for PCT Application Serial No. PCT/US2020/033751 dated Aug. 24, 2020, 14 pages.
Zhao et al., "Improved transmittance and ferroelectric properties realized in KNN ceramics via SAN modification", Journal of the American Ceramic Society, vol. 101, No. 11, May 28, 2018, pp. 5127-5137.
Zhao et al., "Simultaneous realization of high transparency and piezoelectricity in low symmetry KNN-based ceramic,s", Journal of the American Ceramic Society, vol. 102, No. 6, Nov. 26, 2018, pp. 3498-3509.

\* cited by examiner

OPTICALLY TRANSPARENT ACTUATOR

CROSS-REFERENCE TO RELATED APPLICATION

This application claims the benefit of priority under 35 U.S.C. § 119(e) of U.S. Provisional Application No. 62/852,892, filed May 24, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
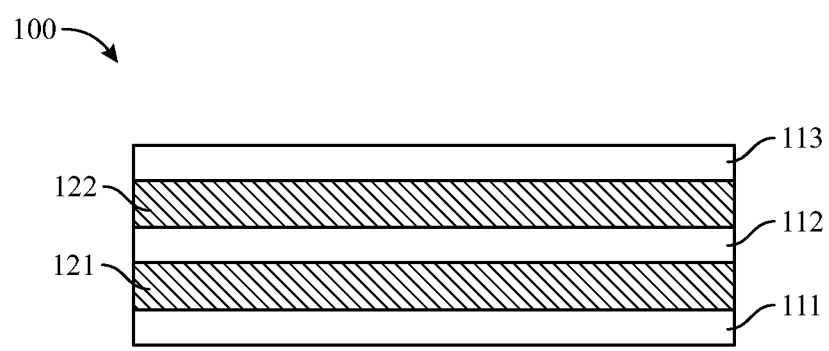
FIG. 1 is a schematic diagram of an example optically transparent bimorph actuator according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Ceramic and other dielectric materials may be incorporated into a variety of optic and electro-optic device architectures, including active and passive optics and electroactive devices. Electroactive materials, including piezoelectric and electrostrictive ceramic materials, may change their shape under the influence of an electric field. Electroactive materials have been investigated for use in various technologies, including actuation, sensing and/or energy harvesting. Lightweight and conformable, electroactive ceramics may be incorporated into wearable devices such as haptic devices and are attractive candidates for emerging technologies including virtual reality/augmented reality devices where a comfortable, adjustable form factor is desired.

Virtual reality and augmented reality eyewear devices or headsets may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of electroactive materials, including the piezoelectric effect to generate a lateral deformation (e.g., lateral expansion or contraction) as a response to compression between conductive electrodes. Example virtual reality/augmented reality assemblies containing electroactive layers may include deformable optics, such as mirrors, lenses, or adaptive optics. Deformation of the electroactive ceramic may be used to actuate optical elements in an optical assembly, such as a lens system.

Although thin layers of many electroactive piezoceramics can be intrinsically transparent, in connection with their incorporation into an optical assembly or optical device, a variation in refractive index between such materials and adjacent layers, such as air, may cause light scattering and a corresponding degradation of optical quality or performance. In a related vein, ferroelectric materials may spontaneously polarize in different directions forming domains and associated birefringent boundaries that scatter light. Further sources of optical scattering include porosity, domain walls, and grain boundaries. Thus, notwithstanding recent developments, it would be advantageous to provide ceramic or other dielectric materials having improved actuation characteristics, including a controllable and robust deformation response in an optically transparent package.

As will be described in greater detail below, the instant disclosure relates to actuatable and transparent optical elements and methods for forming such optical elements. The optical elements may include a layer of electroactive material sandwiched between conductive electrodes. The electroactive layer may be capacitively actuated to deform an optical element and hence modify its optical performance. By configuring an electroactive ceramic to have a small domain and/or grain size, the probability of a scattering event can be decreased, thereby improving optical quality. In certain embodiments, an optical element may be located within the transparent aperture of an optical device such as a liquid lens, although the present disclosure is not particularly limited and may be applied in a broader context. By way of example, the optical element may be incorporated into an active grating, tunable lens, accommodative optical element, or adaptive optics and the like. According to various embodiments, the optical element may be optically transparent.

As used herein, a material or element that is "transparent" or "optically transparent" may, for example, have a transmissivity within the visible light spectrum of at least approximately 50%, e.g., approximately 50, 60, 70, 80, 90, 95, 97, 98, 99, or 99.5%, including ranges between any of the foregoing values, and less than approximately 80% haze, e.g., approximately 1, 2, 5, 10, 20, 30, 40, 50, 60 or 70% haze, including ranges between any of the foregoing values. In accordance with some embodiments, a "fully transparent" material or element may have a transmissivity (i.e., optical transmittance) within the visible light spectrum of at least approximately 75%, e.g., approximately 75, 80, 90, 95, 97, 98, 99, or 99.5%, including ranges between any of the foregoing values, and less than approximately 10% haze, e.g., approximately 0, 1, 2, 4, 6, or 8% haze, including ranges between any of the foregoing values. Transparent and fully transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

Referring to FIG. 1, in accordance with various embodiments, an optical element 100 may include a primary electrode 111, a secondary electrode 112 overlapping at least a portion of the primary electrode, and a first electroactive layer 121 disposed between and abutting the primary electrode 111 and the secondary electrode 112, where the optical element 100 is optically transparent. In the illustrated embodiment, the disclosed bimorph architecture may further include a second electroactive layer 122 disposed over the secondary electrode 112, and a tertiary electrode 113 disposed over the second electroactive layer 122, i.e., opposite to and overlapping at least a portion of the secondary electrode 112.

As used herein, "electroactive materials" may, in some examples, refer to materials that exhibit a change in size or shape when stimulated by an electric field. In the presence of an electrostatic field (E-field), an electroactive material may deform (e.g., compress, elongate, bend, etc.) according to the magnitude and direction of the applied field. Generation of such a field may be accomplished, for example, by placing the electroactive material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external.

In some instances, the physical origin of the compressive nature of electroactive materials in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and elastic compliance of the electroactive material. Compliance in this case is the change of strain with respect to stress or, analogously, in more practical terms, the change in displacement with respect to force. In some embodiments, an electroactive layer may be pre-strained (or pre-stressed) to modify the stiffness of the optical element and hence its actuation characteristics.

In some embodiments, the physical origin of the electromechanical strain of electroactive materials in the presence of an E-field, being the electrically-induced strain in crystalline materials lacking inversion symmetry, derives from the converse piezoelectric effect, which is expressed mathematically with the piezoelectric tensor.

The electroactive layer may include a ceramic material, for example, and the electrodes may each include one or more layers of any suitable conductive material(s), such as transparent conductive oxides (e.g., TCOs such as ITO), graphene, etc. In some embodiments, the ceramic layer may include a transparent polycrystalline ceramic or a transparent single crystal ceramic. In some embodiments, a polycrystalline ceramic lacking a crystallographic center of inversion in its unit cell may have an average grain size of less than 200 nm, and a relative density of at least 99%. Such a ceramic may exhibit a piezoelectric coefficient ($d_{33}$) of at least 20 pC/N when exposed to an applied field of from approximately −2 MV/m to approximately 2 MV/m.

Example electroactive ceramics may include one or more electroactive, piezoelectric, antiferroelectric, relaxor, or ferroelectric ceramics, such as perovskite ceramics, including lead titanate, lead zirconate, lead zirconate titanate, lead magnesium niobate, lead zinc niobate, lead indium niobate, lead magnesium tantalate, lead indium tantalate, barium titanate, lithium niobate, potassium niobate, sodium potassium niobate, bismuth sodium titanate, and bismuth ferrite, as well as solid solutions or mixtures thereof. Example non-perovskite piezoelectric ceramics include quartz and gallium nitride.

In certain embodiments, the electroactive ceramics disclosed herein may be perovskite ceramics and may be substantially free of secondary phases, i.e., may contain less than approximately 2% by volume of any secondary phase, including porosity, e.g., less than 2%, less than 1%, less than 0.5%, less than 0.2%, or less than 0.1%, including ranges between any of the foregoing values. In certain embodiments, the disclosed electroactive ceramics may be birefringent, which may be attributable to the material including plural distinct domains or regions of varying polarization having different refractive indices.

Ceramic electroactive materials, such as single crystal piezoelectric materials, may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes may be formed directly on the wafer, e.g., using chemical vapor deposition or a physical vapor deposition process such as sputtering or evaporation.

In addition to the foregoing, polycrystalline piezoelectric materials may be formed, e.g., by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 µm) particles. In this regard, substitution via doping of $Pb^{2+}$ at A and B-site vacancies with $La^{2+}$ and/or $Ba^{2+}$ may be used to increase the transparency of perovskite ceramics such as PZN-PT, PZT and PMN-PT.

According to some embodiments, ultrafine particle precursors can be fabricated via wet chemical methods, such as chemical co-precipitation, sol-gel and gel combustion. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while minimizing grain growth during sintering. Sintered ceramics may be cut to a desired final shape, and thinning via lapping and/or polishing may be used to decrease surface roughness to achieve thin, highly optically transparent layers that are suitable for high displacement actuation. The electroactive ceramic may be poled to achieve a desired dipole alignment.

As will be appreciated, the methods and systems shown and described herein may be used to form electroactive devices having a single layer or multiple layers of an electroactive material (e.g., a few layers to tens, hundreds, or thousands of stacked layers). For example, an electroactive device may include a stack of from two electroactive elements and corresponding electrodes to thousands of electroactive elements (e.g., approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements, including ranges between any of the foregoing values). A large number of layers may be used to achieve a high displacement output, where the overall device displacement may be expressed as the sum of the displacement of each layer. Such complex arrangements can enable compression, extension, twisting, and/or bending when operating the electroactive device.

In some embodiments, optical elements may include paired electrodes, which allow the creation of the electrostatic field that forces constriction of the electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (such as a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc tin oxide, strontium vanadate, strontium niobate, strontium molybdate, calcium molybdate, and indium zinc tin oxide.

In some embodiments, the electrode or electrode layer may be self-healing, such that damage from local shorting of a circuit can be isolated. Suitable self-healing electrodes may include thin films of materials which deform or oxidize irreversibly upon Joule heating, such as, for example, graphene.

In some embodiments, a primary electrode may overlap (e.g., overlap in a parallel direction) at least a portion of a secondary electrode. The primary and secondary electrodes may be generally parallel and spaced apart and separated by a layer of electroactive material. A tertiary electrode may overlap at least a portion of either the primary or secondary electrode.

An optical element may include a first electroactive layer, which may be disposed between a first pair of electrodes (e.g., the primary electrode and the secondary electrode). A second optical element, if used, may include a second electroactive layer and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include one or more transparent conducting oxides (TCOs) such as indium oxide, tin oxide, indium tin oxide (ITO), indium gallium zinc oxide (IGZO), and the like, graphene, carbon nanotubes, silver nanowires, etc. In other embodiments, relatively rigid electrodes (e.g., electrodes including a metal such as aluminum) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electroactive material may be deposited directly on to an electrode. In some embodiments, an electrode may be deposited directly on to the electroactive material. In some embodiments, electrodes may be prefabricated and attached to an electroactive material. In some embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optic may itself be actuatable. In addition, various methods of forming optical elements are disclosed, including solution-based and solid-state deposition techniques.

In accordance with certain embodiments, an optical element including an electroactive layer disposed between transparent electrodes may be incorporated into a variety of device architectures where capacitive actuation and the attendant strain realized in the electroactive layer (i.e., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional. In some embodiments, the engineered deformation of two or more electroactive layers that are alternatively placed in expansion and compression by oppositely applied voltages may be used to induce bending or curvature changes in a device stack, which may be used to provide optical tuning such as focus or aberration control.

In some applications, an optical element used in connection with the principles disclosed herein may include a primary electrode, a secondary electrode, and an electroactive layer disposed between the primary electrode and the secondary electrode. According to various embodiments, a transparent electroactive layer may be formed by microstructural engineering.

In some embodiments, there may be one or more additional electrodes, and a common electrode may be electrically coupled to one or more of the additional electrodes. For example, optical elements may be disposed in a stacked configuration, with a first common electrode coupled to a first plurality of electrodes, and a second common electrode electrically connected to a second plurality of electrodes. The first and second pluralities may alternate in a stacked configuration, so that each optical element is located between one of the first plurality of electrodes and one of the second plurality of electrodes.

In some embodiments, an optical element (i.e., one or more layers of an electroactive ceramic disposed between and abutting respective electrodes) may have a thickness of approximately 10 nm to approximately 300 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8 µm, approximately 9 µm, approximately 10 µm, approximately 20 µm, approximately 50 µm, approximately 100 µm, approximately 200 µm, or approximately 300 µm), with an example thickness of approximately 200 nm to approximately 500 nm.

The application of a voltage between the electrodes can cause compression or expansion of the intervening electroactive layer(s) in the direction of the applied electric field and an associated expansion or contraction of the electroactive layer(s) in one or more transverse dimensions. In some embodiments, an applied voltage (e.g., to the primary electrode and/or the secondary electrode) may create at least approximately 0.02% strain (e.g., an amount of deformation in the direction of the applied force resulting from the applied voltage divided by the initial dimension of the material) in the electroactive element(s) in at least one direction (e.g., an x, y, or z direction with respect to a defined coordinate system).

In some embodiments, the electroactive response may include a mechanical response to the electrical input that varies over the spatial extent of the device, with the electrical input being applied between the primary electrode and the secondary electrode. The mechanical response may be termed an actuation, and example devices or optical elements may be, or include, actuators.

The optical element may be deformable from an initial state to a deformed state when a first voltage is applied between the primary electrode and the secondary electrode and may further be deformable to a second deformed state when a second voltage is applied between the primary electrode and the secondary electrode.

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive layer between the primary and secondary electrodes. A non-uniform electroactive response may include a curvature of a surface of the optical element, which may in some embodiments be a compound curvature.

In some embodiments, an optical element may have a maximum thickness in an undeformed state and a compressed thickness in a deformed state. In some embodiments, an optical element may have a density in an undeformed state that is approximately 90% or less of a density of the optical element in the deformed state. In some embodiments, an optical element may exhibit a strain of at least approximately 0.02% when a voltage is applied between the primary electrode and the secondary electrode.

In some embodiments, an optical device may include one or more optical elements, and an optical element may include one or more electroactive layers. In various embodiments, an optical element may include a primary electrode, a secondary electrode overlapping at least a portion of the primary electrode, and an electroactive layer disposed between the primary electrode and the secondary electrode.

In some embodiments, the application of an electric field over an entirety of an electroactive layer may generate substantially uniform deformation between the primary and secondary electrodes. In some embodiments, the primary electrode and/or the secondary electrode may be patterned, allowing a localized electric field to be applied to a portion of the optical element, for example, to provide a localized deformation.

According to some embodiments, patterned electrodes (e.g., one or both of a primary electrode and a secondary electrode) may be used to actuate one or more regions within an intervening electroactive layer, i.e., to the exclusion of adjacent regions within the same electroactive layer. For example, spatially-localized actuation of optical elements that include a ceramic electroactive layer can be used to tune the birefringence of such a structure, where the birefringence may be a function of local mechanical stress.

In some embodiments, such patterned electrodes may be independently actuatable. Patterned electrodes may be formed by selective deposition of an electrode layer or by blanket deposition of an electrode layer followed by patterning and etching, e.g., using photolithographic techniques, as known to those skilled in the art. For instance, a patterned electrode may include a wire grid, or a wire grid may be incorporated into an optical element as a separate layer adjacent to an electrode layer. Discretely patterned electrodes may be individually addressable with distinct voltages, either simultaneously or sequentially.

An optical device may include a plurality of stacked elements. For example, each element may include an electroactive layer disposed between a pair of electrodes. In some embodiments, an electrode may be shared between elements; for example, a device may have alternating electrodes and an electroactive layer located between neighboring pairs of electrodes. Various stacked configurations can be constructed in different geometries that alter the shape, alignment, and spacing between elements. Such complex arrangements can enable compression, extension, twisting, and/or bending when operating such an actuator.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

In some embodiments, an optical device may include more (e.g., two, three, or more) such additional electroactive layers and corresponding electrodes. For example, an optical device may include a stack of two or more optical elements and corresponding electrodes. For example, an optical device may include between 2 optical elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 optical elements.

The present disclosure is generally directed to electroactive ceramics and optical elements that include electroactive ceramics. As will be explained in greater detail below, example electroactive ceramics may be characterized by an average grain size of less than 200 nm, a relative density of at least 99%, a transmissivity within the visible spectrum of at least approximately 50%, e.g., at least 50, 60, 70, 80, 90, 95, 97, 98, 99, or 99.5%, including ranges between any of the foregoing values, and a piezoelectric coefficient ($d_{33}$) of at least 20 pC/N, e.g., 20, 30, 50, 100, 150 or 200 pC/N, including ranges between any of the foregoing values, when exposed to an applied field of from approximately −2 MV/m to approximately 2 MV/m. In particular embodiments, the optical properties of the disclosed electroactive ceramics, including transmissivity, haze, and clarity, may be stable (i.e., substantially invariant) in response to an applied voltage.

The piezoelectric coefficient, which herein is synonymous with the inverse piezoelectric coefficient (d), may be used to quantify (a) strain when a piezoelectric material is subject to an electric field, or (b) a polarization in response to the application of a stress. Typical units for the piezoelectric coefficient are Coulombs/Newton or meters/volt.

By way of example, in response to an applied voltage, the electroactive ceramics disclosed herein may exhibit a change in transmissivity of less than approximately 50%, e.g., 5%, 10%, 15%, 20%, 25%, 30%, 35%, 40%, or 45%, including ranges between any of the foregoing values; a change in haze of less than approximately 50%, e.g., 5%, 10%, 15%, 20%, 25%, 30%, 35%, 40%, or 45%, including ranges between any of the foregoing values; and/or a change in clarity of less than approximately 50%, e.g., 5%, 10%, 15%, 20%, 25%, 30%, 35%, 40%, or 45%, including ranges between any of the foregoing values. In various embodiments, the applied voltage may range from approximately −2 MV/m to 2 MV/m, e.g., −2, −1.5, −1, −0.5, 0, 0.5, 1, 1.5, or 2 MV/m, including ranges between any of the foregoing values. In various embodiments, the applied voltage may be an electric field equal to at least approximately 50% of the breakdown strength of the electroactive ceramic, e.g., 50%, 60%, 70%, 80%, or 90% of the breakdown strength, including ranges between any of the foregoing values. In various embodiments, the applied voltage may be an electric field equal to at least approximately 50% of the coercive field of the electroactive ceramic, e.g., 50%, 75%, 100%, 125%, 150%, 175%, or 200% of the coercive field, including ranges between any of the foregoing values.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, detailed descriptions of methods, systems and apparatus for forming actively tunable optical elements that include a layer of a transparent and voltage-stable electroactive ceramic. The discussion associated with FIG. 1 includes a description of an optical element according to some embodiments. The discussion associated with FIG. 2 includes a description of optical scattering for an electroactive ceramic material including ferroelectric domains. The discussion associated with FIGS. 3-9 includes a description of modeled optical losses for example layers of an electroactive ceramic material. The discussion associated with FIGS. 10-12 relates to exemplary virtual reality and augmented reality device architectures that may include an optical element including an actuatable transparent electroactive ceramic layer.

In various approaches, the optical transmissivity of electroactive materials, including piezoelectric materials, may be improved through domain engineering or the elimination of porosity. In such methods, decreasing the domain size or adding dopants to disrupt long-range domain formation, degree of anisotropy and/or birefringence has been used to form transparent compositions, albeit in the absence of an applied electric field. For many domain engineered materials, the application of an electric field, especially greater than approximately 0.5 MV/m, has been observed to significantly decrease transmissivity as domains grow and coalesce or as the material undergoes distortion under an applied E-field, which may render it more highly birefringent.

Figure 2:
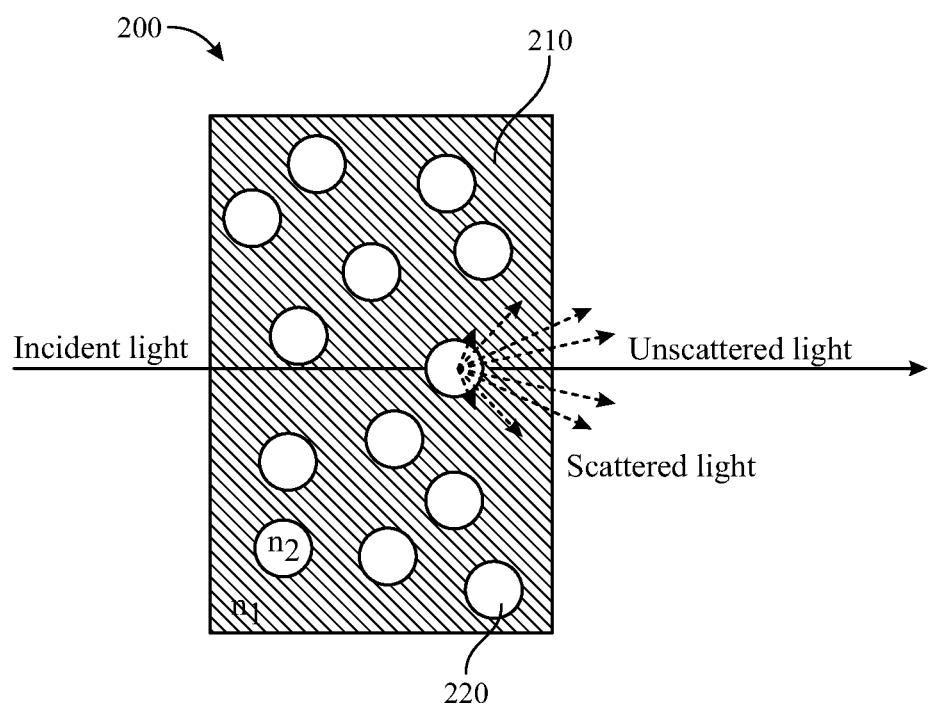
FIG. 2 shows optical scattering from discrete domains located within an example electroactive ceramic according to some embodiments.

Referring to FIG. 2, the propagation of light through domain engineered materials may be modeled by calculating scattering using the full Mie scattering solution of independent particles, where electroactive material layer 200 may include an electroactive matrix 210 and plural ferroelectric domains 220 dispersed throughout the matrix 210. Matrix 210 may have a refractive index n1, while domains 220 may have a refractive index n2.

Figure 3:
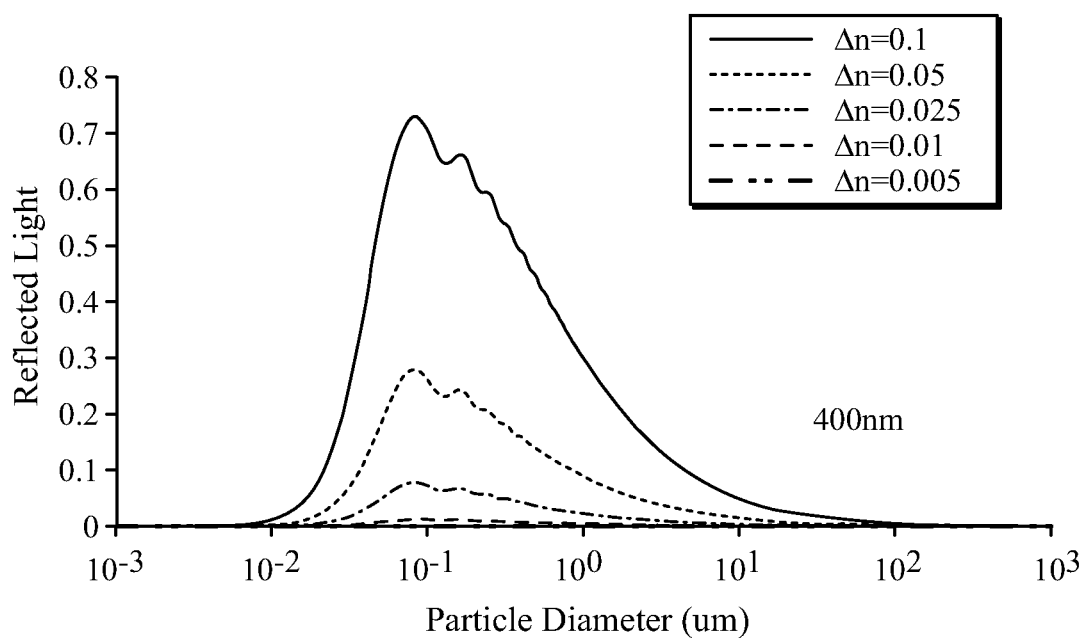
FIG. 3 is a plot showing the effect of particle diameter on the reflection of blue incident light for an example electroactive ceramic layer according to some embodiments.
Figure 4:
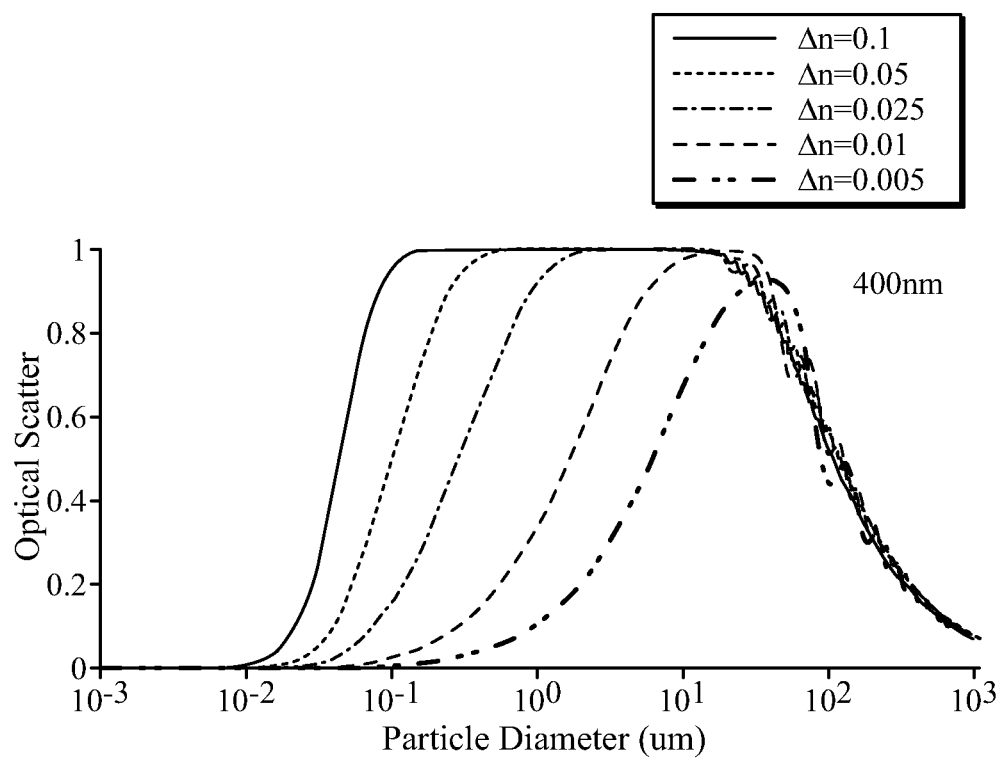
FIG. 4 is a plot showing the effect of particle diameter on the scattering of blue incident light for an example electroactive ceramic layer according to some embodiments.
Figure 5:
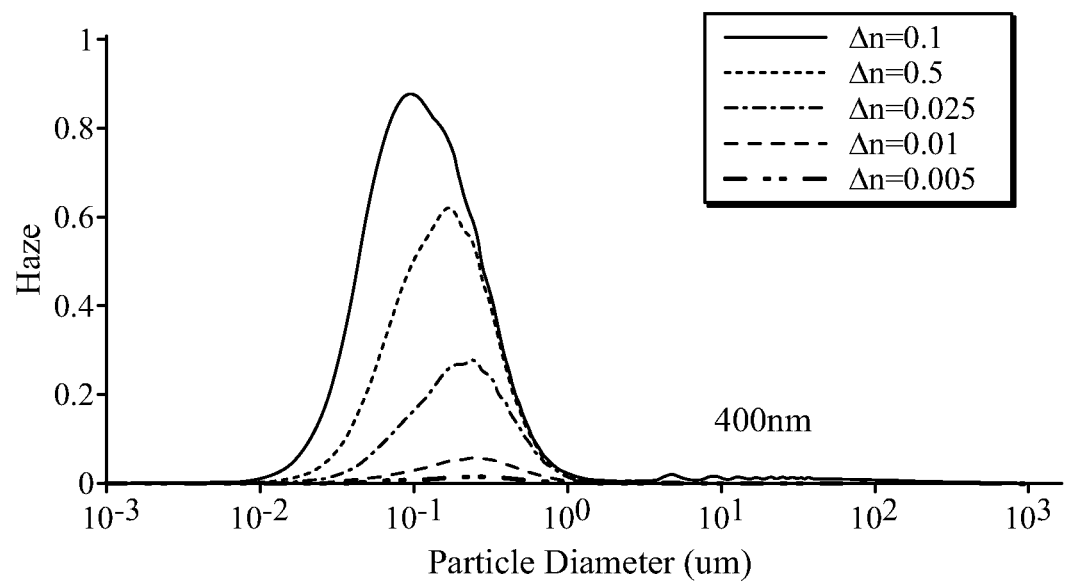
FIG. 5 is a plot of haze versus particle diameter for an example electroactive ceramic layer exposed to incident blue light according to some embodiments.

For a 50 micrometer thick electroactive layer (n1=2.6; n2=n1+Δn) with incident light having a wavelength of 400 nm, optical losses (e.g., reflected light, scattered light, and haze) are plotted as a function of domain size in FIGS. 3-5, respectively, for different values of Δn. According to some embodiments, the amount of reflected (backscattered) light from particle scattering is shown in FIG. 3. Referring to FIG. 4, an electroactive layer having less than 10% optical scatter can be achieved with domain sizes less than 20, 30, 70, 150, or 1000 nm, for Δn values of 0.1, 0.05, 0.025, 0.01, and 0.005, respectively. Furthermore, with reference to FIG. 5, the impact of domain size on haze is illustrated.

Figure 6:
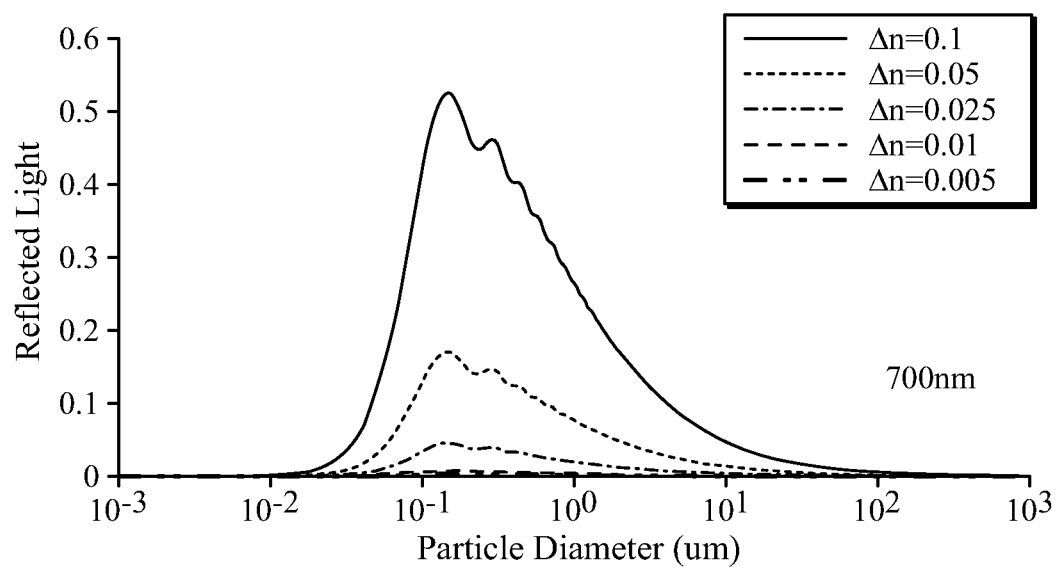
FIG. 6 is a plot showing the effect of particle diameter on the reflection of red incident light for an example electroactive ceramic layer according to some embodiments.
Figure 7:
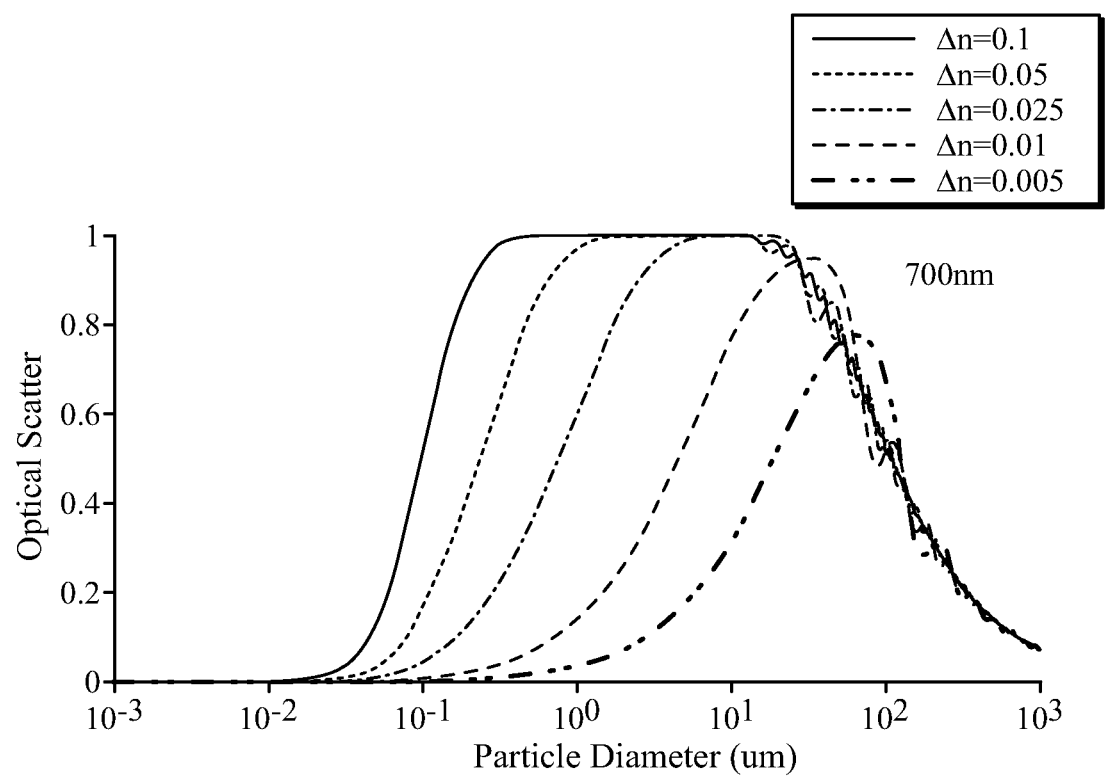
FIG. 7 is a plot showing the effect of particle diameter on the scattering of red incident light for an example electroactive ceramic layer according to some embodiments.
Figure 8:
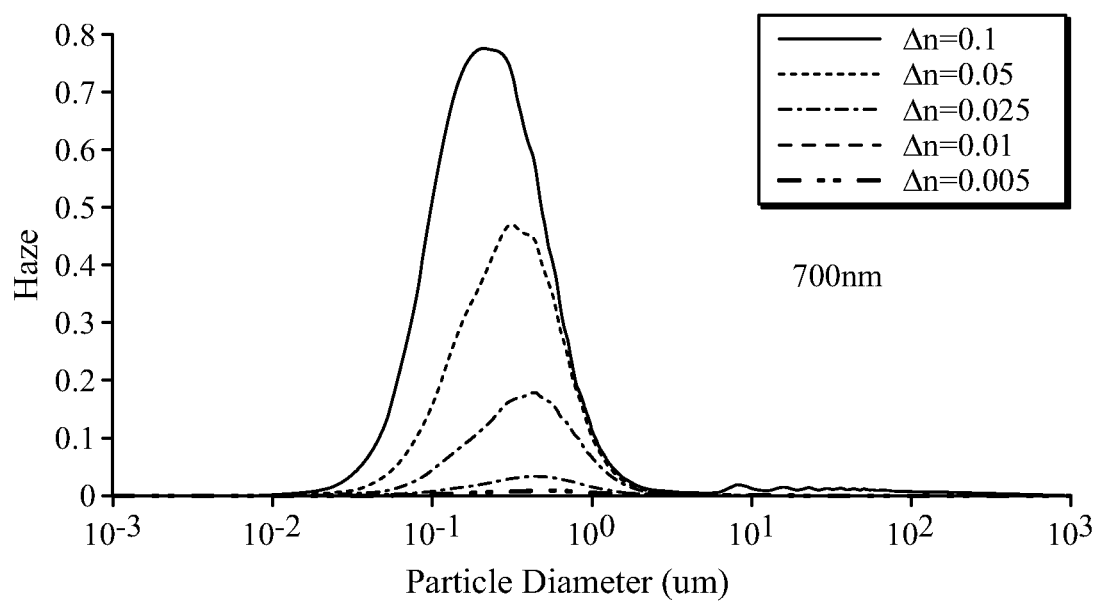
FIG. 8 is a plot of haze versus particle diameter for an example electroactive ceramic layer exposed to incident red light according to some embodiments.

Additional data, analogous to the data disclosed in FIGS. 3-5, are shown in FIGS. 6-8 for incident light having a wavelength of 700 nm. The results for 700 nm incident light are comparable to the result for 400 nm light, noting that the curve maxima are consistently shifted to larger particle diameters, indicative of improved optical quality for a given domain size. As will be appreciated, the data in FIGS. 3-8 can be used to domain engineer electroactive layers exhibiting desired amounts of reflected light, optical scatter and/or haze.

According to various embodiments, the detrimental impact of domain growth and coalescence on the transparency of polycrystalline ceramic compositions can be mitigated by limiting their grain size. That is, Applicants have shown that because grain boundaries inhibit inter granular domain growth and coalescence, optically transparent and voltage-stable electroactive ceramics may include sub-micron scale crystalline grains.

Furthermore, as the grain size of the material is decreased, the degree of tetragonality (and correspondingly the degree of anisotropy) is decreased as well, which may advantageously decrease the value of Δn. Therefore, a smaller grain size may correlate to less scatter at a given value of Δn as well as a smaller Δn value for a given composition.

Figure 9:
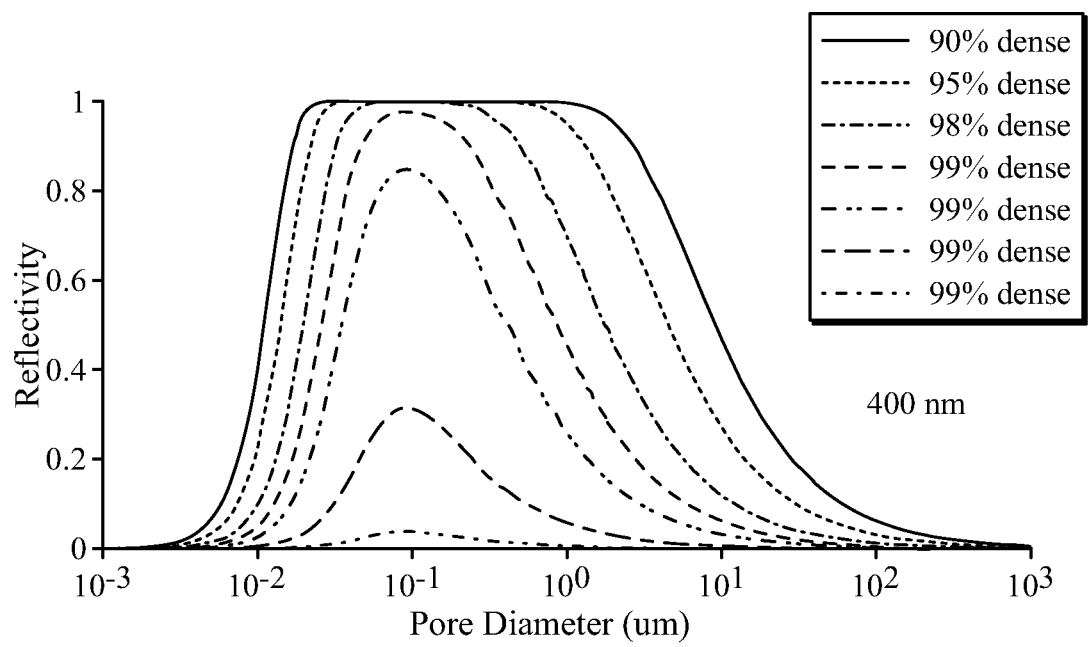
FIG. 9 is a plot showing the effect of pore diameter on the reflection of blue incident light for an example electroactive ceramic layer according to certain embodiments.

According to some embodiments, a voltage-stable electroactive ceramic having a transmissivity within the visible spectrum of at least 50% includes an average grain size of less than approximately 200 nm, e.g., 2, 4, 10, 20, 50, 100, 150, or 200 nm, including ranges between any of the foregoing values, and a relative density of at least approximately 99%, e.g., 99, 99.5, 99.9, or 99.99% dense, including ranges between any of the foregoing values. The combination of small grain size and high density, which are typically difficult to achieve simultaneously due to grain growth that is ubiquitous with sintering, may both restrict domain growth and limit scattering from pores. The effect of porosity on the reflectivity of 400 nm incident light is shown in FIG. 9 for variable density electroactive layers having a total thickness of 50 micrometers.

Example methods of forming dense, optically transparent electroactive ceramics may include forming ceramic powders, mixing, calcination, milling, green body formation, and high temperature sintering.

High-purity raw materials for the electroactive ceramic composition may include PbO, $Pb_3O_4$, $ZrO_2$, $TiO_2$, MgO, $Mg(OH)_2$ $MgCO_3$, $MnO_2$, $Nb_2O_5$, and $La_2O$, as well as respective hydrates thereof. In some embodiments, the raw materials may be at least approximately 99.9% pure, e.g., 99.9%, 99.95%, or 99.99% pure, including ranges between any of the foregoing values.

Precursor powders of suitable reactant compositions may be prepared by flame spray pyrolysis, for example, whereby an aerosol of an appropriate metal salt, chelate, coordination compound, etc., may be sprayed into a furnace and heated to a temperature sufficient to evaporate the solvent and form nanoscale particles. Precursor powders may also be synthesized by hydrothermal processes, sol-gel processes, or solvothermal processes, as known to those skilled in the art.

Before or after mixing, precursor powders may be milled to produce a desired particle size. Example milling processes include ball milling, e.g., planetary ball milling, and attrition milling, although other milling processes are contemplated. During milling, the particles may be dry or mixed with a liquid such as ethanol. Example precursor powders, i.e., prior to sintering, may have an average particle size of less than approximately 500 nm, e.g., less than approximately 500 nm, less than approximately 400 nm, less than approximately 300 nm, less than approximately 250 nm, less than approximately 200 nm, less than approximately 150 nm, less than approximately 100 nm, less than approximately 50 nm, or less than approximately 25 nm, including ranges between any of the foregoing values, although precursor powders having a larger average particle size may be used.

In some embodiments, the milled powders may be calcined for a period of approximately 1 hr to approximately 24 hr, e.g., 1, 2, 4, 10, 15, 20 or 24 hr, at a temperature ranging from approximately 300° C. to approximately 1000° C., e.g., 300° C., 400° C., 500° C., 600° C., 700° C., 800° C., 900° C. or 1000° C., including ranges between any of the foregoing values. Calcination may be performed in an oxidizing environment, for example, and may be used to remove unwanted impurities, including organic impurities such as carbon.

According to various embodiments, a powder mixture may be compacted into a pellet or dispersed in a liquid and cast into a thin film to produce a desired form factor. For instance, a powder mixture may be compacted by applying a uniaxial pressure of approximately 10 MPa to approximately 500 MPa, e.g., 10, 15, 20, 25, 30, 50, 100, 200, 300, 400, or 500 MPa, including ranges between any of the foregoing values.

The shaped bodies may be sintered. In some embodiments, the sintering temperature may range from approximately 750° C. to approximately 1400° C., e.g., 750° C., 800° C., 900° C., 1000° C., 1100° C., 1200° C., 1300° C., or 1400° C., including ranges between any of the foregoing values. In certain embodiments, the powders may be sintered in a controlled atmosphere, such as an oxidizing atmosphere, a reducing atmosphere, or under vacuum. In certain embodiments, pressure, e.g., uniaxial pressure, may be applied during sintering. Example sintering processes include conventional sintering, spark plasma sintering, flash sintering, or sintering using microwaves.

According to some embodiments, the sintered ceramic may be heated, e.g., under oxidizing or reducing conditions, to adjust the oxygen stoichiometry. Such a post-sintering anneal may be performed under vacuum or at approximately atmospheric pressure. In some embodiments, during a post-sinter heating step, the ceramic may be annealed within a bed of the precursor powder mixture, which may inhibit the evaporation of lead. In various embodiments, the densified ceramic may be ground, lapped and/or polished to achieve a smooth surface. In example embodiments, a transparent electroactive ceramic may have a surface roughness of less than approximately 50 nm and exhibit less than 10% haze.

In an example method, magnesium oxide and niobium oxide powders may be ball milled in ethanol and calcined at 300° C.-1000° C. for 1 to 24 hr. To inhibit the formation of non-perovskite phases, lead oxide and titanium oxide powders may be added following the foregoing calcination step, and the mixture may then be ball milled in ethanol and calcined at 500° C.-1200° C. for 0.5 to 12 hr. Following the second calcination step, the powder mixture may be milled, compacted under a uniaxial pressure of 10-500 MPa and, while maintaining the applied pressure, sintered by spark plasma sintering at 750° C.-1150° C. In some embodiments, the sintered ceramic may be heated to 400° C.-1400° C. for 2-24 hr in an oxidizing environment. Following sintering, the lead zirconium magnesium titanate ceramic composition may have a relative density greater than approximately 99% and an average grain size of less than approximately 200 nm.

In a further method, powders of lead oxide, zirconium oxide, and titanium oxide may be combined in an appropriate ratio and milled to form a powder mixture having an average particle size of less than 500 nm. The powder mixture may be heated (calcined) at approximately 300° C.-700° C. to remove excess carbon. The calcined powder may be sintered to form a dense, transparent ceramic having an average grain size of less than approximately 200 nm.

In some embodiments, a ceramic powder may be derived from a solution of one or more salts, chelates, and/or coordination complexes of, for example, lead, zirconium, and titanium, although further or alternate metal compounds may be used. The solution may be distilled, evaporated, and dried to form a compositionally homogeneous powder. The powder mixture may be milled to an average particle size of less than approximately 300 nm, calcined to remove residual carbon, compacted, and sintered to form a dense, transparent ceramic having an average grain size of less than approximately 200 nm, a relative density of at least 99%, and a transmissivity within the visible spectrum of at least 50%.

As disclosed herein, an optically transparent actuator may include a pair of electrodes and a layer of an electroactive ceramic disposed between the electrodes. Methods of manufacturing the ceramic layer can achieve a dense, nanocrystalline structure having a robust suite of optical properties. That is, the transmissivity, optical clarity, and haze characteristics of the ceramic present a high optical quality layer without exhibiting appreciable degradation in any of the foregoing characteristics under an applied electric field. For instance, an example ceramic layer may maintain greater than 75% transmissivity and less than 10% haze under applied fields of 1 MV/m and greater. In particular embodiments, optical scattering, which may be a significant detractor to optical transparency, may be controlled during manufacturing by engineering a microstructure that is greater than 99% dense with a grain size of less than 200 nm. In conventional ceramics, such high density and small grain size may be difficult to achieve simultaneously, but may be obtained, for example, through powder processing, including powder modification (e.g. milling to achieve a sub-micron particle size), calcination, green body formation, and high temperature sintering. The ceramic may include a ferroelectric composition, such as a lead zirconate titanate (PZT)-based material, or another perovskite ceramic.

EXAMPLE EMBODIMENTS

Example 1

An electroactive ceramic lacking a crystallographic center of inversion in its unit cell and further including an average grain size of less than approximately 200 nm, a relative density of at least 99%, and a transmissivity within the visible spectrum of at least 50%.

Example 2

The electroactive ceramic of Example 1, further exhibiting less than 10% haze.

Example 3

The electroactive ceramic of any of Examples 1 and 2, wherein the transmissivity within the visible spectrum is at least 75%.

Example 4

The electroactive ceramic of any of Examples 1-3, characterized by at least one of (a) less than a 50% change in the transmissivity, (b) a change in haze of less than 50%, and (c) a change in clarity of less than 50%, when exposed to an applied field of from approximately −2 MV/m to approximately 2 MV/m.

Example 5

The electroactive ceramic of any of Examples 1-4, characterized by (a) less than a 50% change in the transmissivity, (b) a change in haze of less than 50%, and (c) a change in clarity of less than 50%, when exposed to an applied field of from approximately −2 MV/m to approximately 2 MV/m.

Example 6

The electroactive ceramic of any of Examples 1-3, characterized by (a) less than a 50% change in the transmissivity, (b) a change in haze of less than 50%, and (c) a change in clarity of less than 50%, when exposed to an applied field equal to at least 50% of its breakdown strength.

Example 7

The electroactive ceramic of any of Examples 1-3, characterized by (a) less than a 50% change in the transmissivity, (b) a change in haze of less than 50%, and (c) a change in clarity of less than 50%, when exposed to an applied field equal to at least 50% of its coercive field.

Example 8

The electroactive ceramic of any of Examples 1-7, further including at least one compound selected from the group consisting of lead titanate, lead zirconate, lead zirconate titanate, lead magnesium niobate, lead zinc niobate, lead indium niobate, lead magnesium tantalate, lead indium tantalate, barium titanate, lithium niobate, potassium niobate, sodium potassium niobate, bismuth sodium titanate, and bismuth ferrite.

Example 9

The electroactive ceramic of any of Examples 1-8, further including a solid solution of two or more of lead titanate, lead zirconate, lead zirconate titanate, lead magnesium niobate, lead zinc niobate, lead indium niobate, lead magnesium tantalate, lead indium tantalate, barium titanate, lithium niobate, potassium niobate, sodium potassium niobate, bismuth sodium titanate, and bismuth ferrite.

Example 10

The electroactive ceramic of any of Examples 1-9, including at least one dopant selected from the group consisting of niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

Example 11

The electroactive ceramic of any of Examples 1-10, having an RMS surface roughness of less than approximately 50 nm.

Example 12

The electroactive ceramic of any of Examples 1-11, consisting essentially of a perovskite ceramic.

Example 13

An optical element including a primary electrode, a secondary electrode overlapping at least a portion of the primary electrode, and an electroactive layer disposed between and abutting the primary electrode and the secondary electrode, wherein the electroactive layer includes an average grain size of less than 200 nm, a relative density of at least 99%, and a transmissivity within the visible spectrum of at least 50%.

Example 14

The optical element of Example 13, where the electroactive layer has an RMS surface roughness of less than approximately 50 nm.

Example 15

The optical element of any of Examples 13 and 14, where the electroactive layer includes a perovskite ceramic.

Example 16

The optical element of any of Examples 13-15, where the electroactive layer exhibits less than a 50% change in each of transparency, haze, and clarity when a voltage is applied to the primary electrode.

Example 17

A head-mounted display including the optical element of any of Examples 13-16.

Example 18

A method includes forming a powder mixture and sintering the powder mixture to form an electroactive ceramic, wherein the electroactive ceramic includes (a) an average grain size of less than 200 nm, (b) a relative density of at least 99%, and (c) a transmissivity within the visible spectrum of at least 50%.

Example 19

The method of Example 18, wherein forming the powder mixture includes forming a partial powder mixture, where the partial powder mixture is lead free, calcining the partial powder mixture, and adding lead oxide to the calcined partial powder mixture to form the powder mixture.

Example 20

The method of any of Examples 18 and 19, further including forming a transparent electrode over the electroactive ceramic.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1000 in FIG. 10. Other artificial reality systems may include a NED that also provides visibility into the real world (e.g., augmented-reality system 1100 in FIG. 11) or that visually immerses a user in an artificial reality (e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 10:
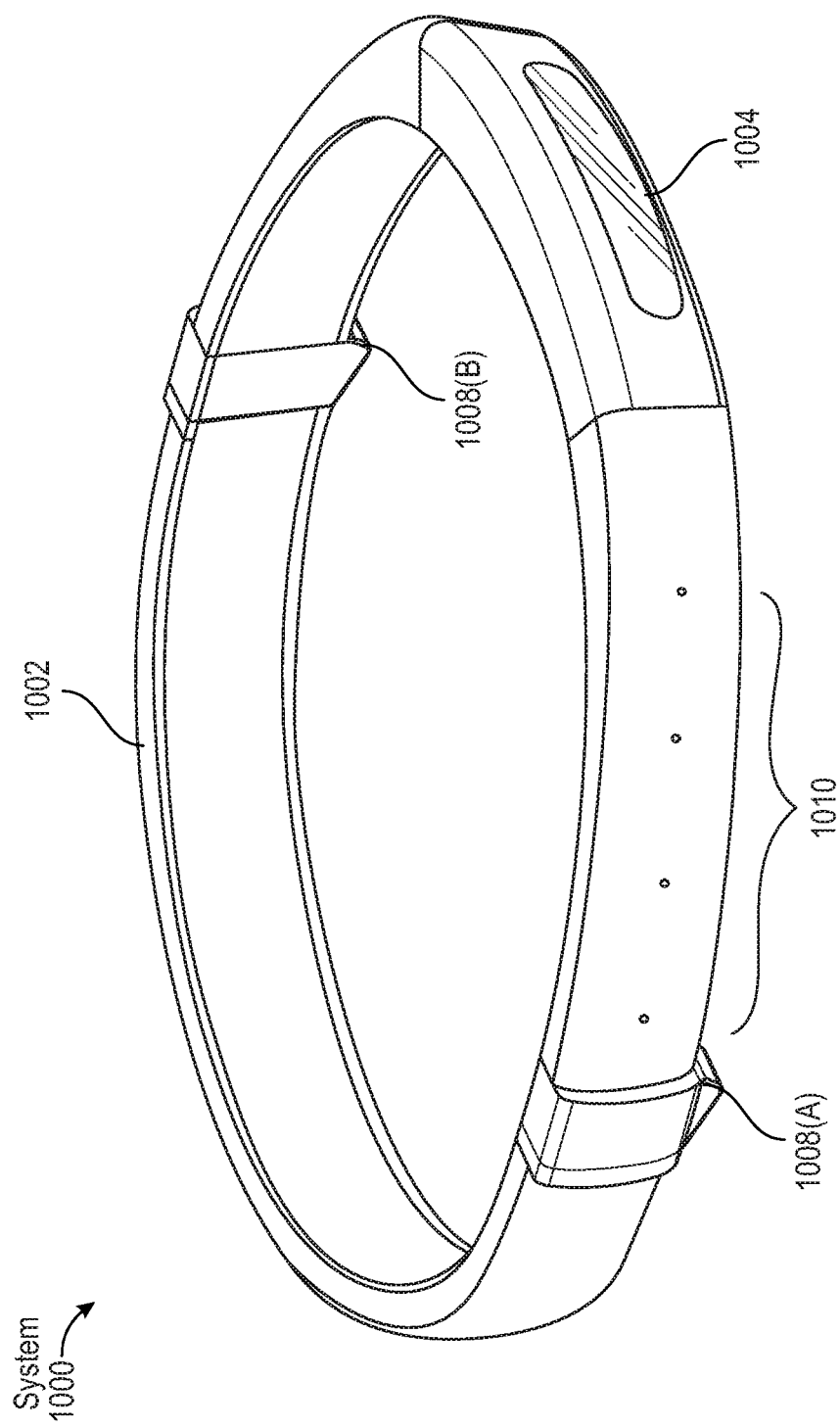
FIG. 10 is an illustration of an exemplary artificial-reality headband that may be used in connection with embodiments of this disclosure.

Turning to FIG. 10, augmented-reality system 1000 generally represents a wearable device dimensioned to fit about a body part (e.g., a head) of a user. As shown in FIG. 10, system 1000 may include a frame 1002 and a camera assembly 1004 that is coupled to frame 1002 and configured to gather information about a local environment by observing the local environment. Augmented-reality system 1000 may also include one or more audio devices, such as output audio transducers 1008(A) and 1008(B) and input audio transducers 1010. Output audio transducers 1008(A) and 1008(B) may provide audio feedback and/or content to a user, and input audio transducers 1010 may capture audio in a user's environment.

As shown, augmented-reality system 1000 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1000 may not include a NED, augmented-reality system 1000 may include other types of screens or visual feedback devices (e.g., a display screen integrated into a side of frame 1002).

Figure 11:
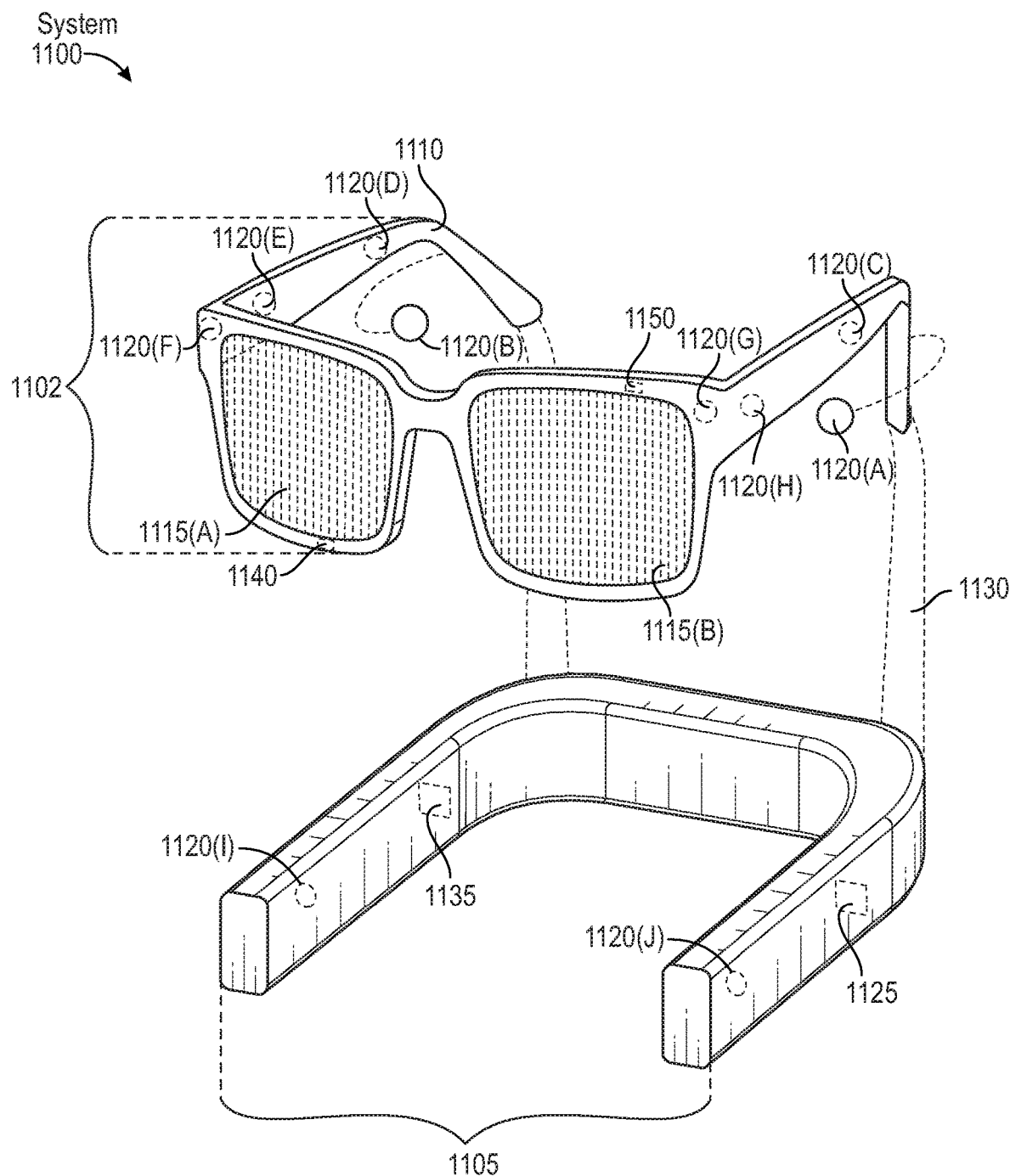
FIG. 11 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent a position sensor, an inertial measurement unit (IMU), a depth camera assembly, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

Augmented-reality system 1100 may also include a microphone array with a plurality of acoustic transducers 1120(A)-1120(J), referred to collectively as acoustic transducers 1120. Acoustic transducers 1120 may be transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(F) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by the controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer, or some combination thereof.

Acoustic transducers 1120(A) and 1120(B) may be positioned on different parts of the user's ear, such as behind the pinna or within the auricle or fossa. Or, there may be additional acoustic transducers on or surrounding the ear in addition to acoustic transducers 1120 inside the ear canal. Having an acoustic transducer positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments, acoustic transducers 1120(A) and 1120(B) may be connected to augmented-reality system 1100 via a wireless connection (e.g., a Bluetooth connection). In still other embodiments, acoustic transducers 1120(A) and 1120(B) may not be used at all in conjunction with augmented-reality system 1100.

Acoustic transducers 1120 on frame 1110 may be positioned along the length of the temples, across the bridge, above or below display devices 1115(A) and 1115(B), or some combination thereof. Acoustic transducers 1120 may be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers and other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(1) and 1120(J)) that are part of the microphone array (or potentially form their own microphone subarray). Neckband 1105 may also include a controller 1125 and a power source 1135.

Acoustic transducers 1120(1) and 1120(J) of neckband 1105 may be configured to detect sound and convert the detected sound into an electronic format (analog or digital). In the embodiment of FIG. 11, acoustic transducers 1120(1) and 1120(J) may be positioned on neckband 1105, thereby increasing the distance between the neckband acoustic transducers 1120(1) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1200 and/or virtual-reality system 1200 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1000, augmented-reality system 1100, and/or virtual-reality system 1200 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 10 and 12, output audio transducers 1008(A), 1008(B), 1206(A), and 1206(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1010 may include condenser microphones, dynamic microphones, ribbon microphones, and/or any other type or form of input transducer. In some embodiments, a single transducer may be used for both audio input and audio output.

Figure 12:
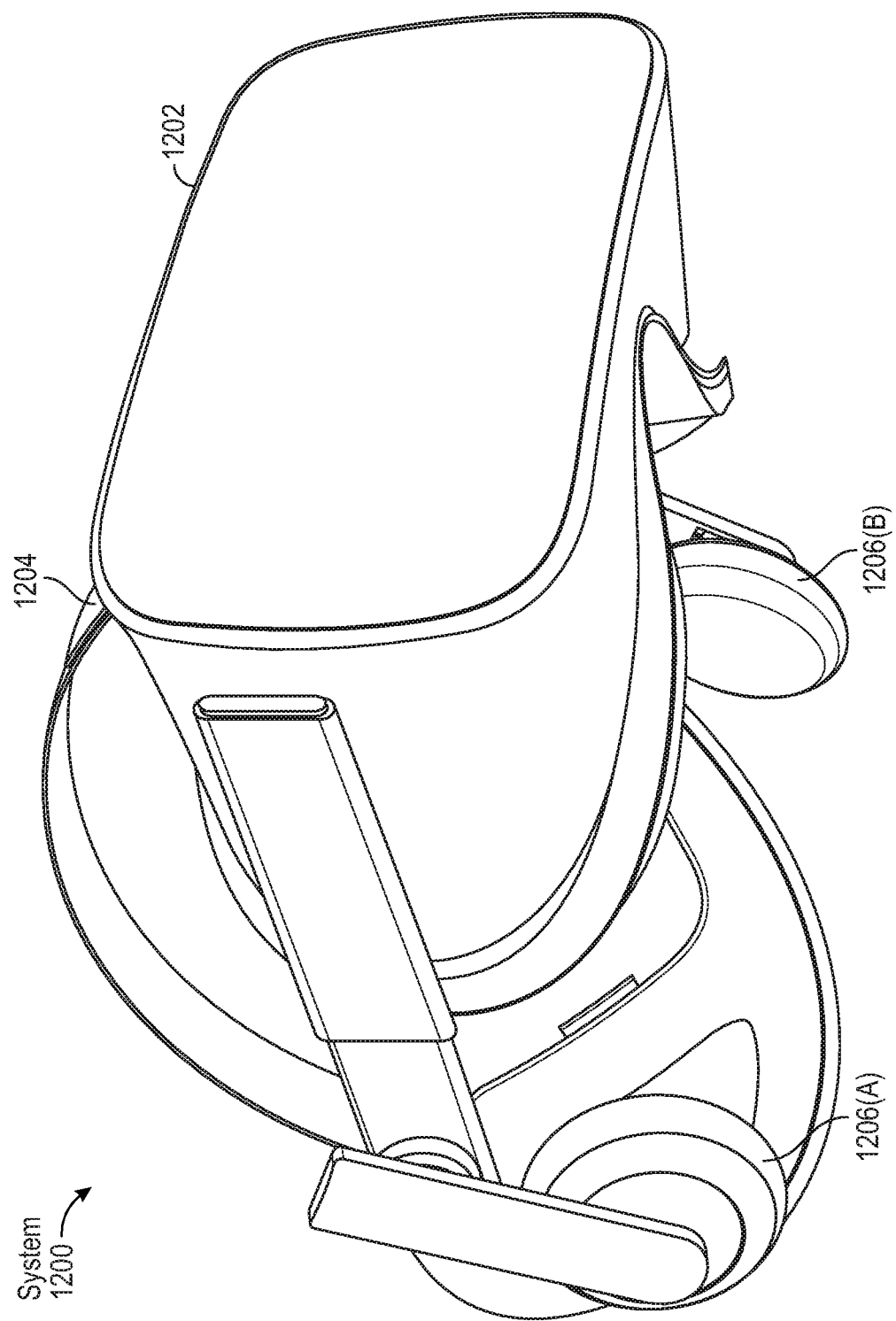
FIG. 12 is an illustration of an exemplary virtual-reality headset that may be used in connection with embodiments of this disclosure.

While not shown in FIGS. 10-12, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An electroactive ceramic lacking a crystallographic center of inversion in its unit cell, and further comprising:
    an average grain size of less than approximately 200 nm;
    a relative density of at least 99%; and
    a transmissivity within the visible spectrum for a thickness ranging from approximately 10 nanometers to approximately 300 micrometers of at least 50%.

2. The electroactive ceramic of claim 1, further comprising less than 10% haze.

3. The electroactive ceramic of claim 1, wherein the transmissivity within the visible spectrum is at least 75%.

4. The electroactive ceramic of claim 1, when exposed to an applied field of from approximately −2 MV/m to approximately 2 MV/m, comprises at least one of:
    less than a 50% change in the transmissivity;
    a change in haze of less than 50%, and
    a change in clarity of less than 50%.

5. The electroactive ceramic of claim 1, when exposed to an applied field of from approximately −2 MV/m to approximately 2 MV/m, comprises:
    less than a 50% change in the transmissivity;
    a change in haze of less than 50%, and
    a change in clarity of less than 50%.

6. The electroactive ceramic of claim 1, when exposed to an applied field equal to at least 50% of its breakdown strength, comprises at least one of:
    less than a 50% change in the transmissivity;

a change in haze of less than 50%, and
a change in clarity of less than 50%.

7. The electroactive ceramic of claim 1, when exposed to an applied field equal to at least 50% of its coercive field, comprises at least one of:
   less than a 50% change in the transmissivity;
   a change in haze of less than 50%, and
   a change in clarity of less than 50%.

8. The electroactive ceramic of claim 1, wherein the electroactive ceramic comprises at least one compound selected from the group consisting of lead titanate, lead zirconate, lead zirconate titanate, lead magnesium niobate, lead zinc niobate, lead indium niobate, lead magnesium tantalate, lead indium tantalate, barium titanate, lithium niobate, potassium niobate, sodium potassium niobate, bismuth sodium titanate, and bismuth ferrite.

9. The electroactive ceramic of claim 1, wherein the electroactive ceramic comprises a solid solution of two or more of lead titanate, lead zirconate, lead zirconate titanate, lead magnesium niobate, lead zinc niobate, lead indium niobate, lead magnesium tantalate, lead indium tantalate, barium titanate, lithium niobate, potassium niobate, sodium potassium niobate, bismuth sodium titanate, and bismuth ferrite.

10. The electroactive ceramic of claim 1, further comprising at least one dopant selected from the group consisting of niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

11. The electroactive ceramic of claim 1, further comprising an RMS surface roughness of less than approximately 50 nm.

12. The electroactive ceramic of claim 1, consisting essentially of a perovskite ceramic.

13. An optical element, comprising:
    a primary electrode;
    a secondary electrode overlapping at least a portion of the primary electrode; and
    an electroactive layer disposed between and abutting the primary electrode and the secondary electrode, wherein the electroactive layer comprises:
    an average grain size of less than 200 nm;
    a relative density of at least 99%; and
    a transmissivity within the visible spectrum of at least 50%.

14. The optical element of claim 13, wherein the electroactive layer comprises an RMS surface roughness of less than approximately 50 nm.

15. The optical element of claim 13, wherein the electroactive layer comprises a perovskite ceramic.

16. The optical element of claim 13, wherein the electroactive layer comprises less than a 50% change in each of transparency, haze, and clarity when a voltage is applied to the primary electrode.

17. A head-mounted display comprising the optical element of claim 13.

18. A method comprising:
    forming a powder mixture; and
    sintering the powder mixture to form an electroactive ceramic, wherein the electroactive ceramic comprises:
    an average grain size of less than 200 nm,
    a relative density of at least 99%, and
    a transmissivity within the visible spectrum for a thickness ranging from approximately 10 nanometers to approximately 300 micrometers of at least 50%.

19. The method of claim 18, wherein forming the powder mixture comprises:
    forming a partial powder mixture, wherein the partial powder mixture is lead free;
    calcining the partial powder mixture; and
    adding lead oxide to the calcined partial powder mixture to form the powder mixture.

20. The method of claim 18, further comprising forming a transparent electrode over the electroactive ceramic.

* * * * *